Jan. 28, 1964 H. LINSTEDT 3,119,362

ALLOYING FIXTURE

Filed Dec. 24, 1959 2 Sheets-Sheet 1

INVENTOR.
HANS LINSTEDT

BY

ATTORNEY

Jan. 28, 1964 H. LINSTEDT 3,119,362

ALLOYING FIXTURE

Filed Dec. 24, 1959 2 Sheets-Sheet 2

INVENTOR.
HANS LINSTEDT

BY

ATTORNEY 3,119,362

ALLOYING FIXTURE

Hans Linstedt, Stuttgart, Germany, assignor to Clevite Corporation, Cleveland, Ohio, a corporation of Ohio Filed Dec. 24, 1959, Ser. No. 861,967
Claims priority, application Germany Jan. 2, 1959
7 Claims. (Cl. 113—99)

This invention relates to fixtures for the formation of rectifying PN junctions in semiconductive materials by alloying.

One of the most widely used methods of fabricating semiconductor devices at the present time involves the formation, of PN rectifying junctions by alloying a body of appropriate alloy metal to the surface of a wafer of semiconductive material of the desired conductivity type. In the fabrication of diodes only a single PN junction is formed; for transistors two PN junctions may be prepared in the same manner on opposite faces of the semiconductor wafer, preferably in precise alignment with each other. For purposes of example only, the present invention will be described with reference to the fabrication of such a transistor.

Alloying is customarily accomplished by disposing the wafer and the alloying metals in proper relative positions in an alloying boat, suitably weighting down the assembly to insure intimate physical contact between the alloying metal and the respective surfaces of the wafer, and placing the loaded boat in an alloying furnace.

It is well known in the art that the formation of the PN junctions is one of the critical phases of production of semiconductor devices and is an extremely delicate and sensitive operation. The quality of the junction depends not only on the physical dimensions and geometry of the recrystallized alloy region, but also on its crystallographic structure and the concentration gradient of the alloying material therein. Despite persistent and continuing efforts in the field, PN junctions produced by commercial techniques still fall far short of the desired or optimum quality.

The present invention is based on the discovery that improved PN junctions can be formed by judicious control of the heat transfer to and from the alloying zone during the alloying process. Accordingly, the invention contemplates alloying fixtures for use in the formation of PN junctions which produce the desired heat transfer during alloying, relegating the heat transfer by radiation and conduction primarily to a path through the wafer and parallel to the planes of its major surfaces.

It is the fundamental object of the present invention to provide means for the formation of superior PN rectifying junctions in semiconductor devices.

A more specific object is the provision of novel alloying fixtures which enable the formation of improved thermodynamic conditions during the alloying of PN junctions in semiconductor materials.

Another object is the provision of improved alloying fixtures enabling the control of heat transfer during the alloying of PN junctions to semiconductor materials.

These and other objects are accomplished by alloying fixtures in accordance with the present invention which comprise an alloying boat containing a bore of substantial length adapted to receive, in a plane substantially perpendicular to its longitudinal axis, a semiconductor wafer. Means are provided for impeding heat transfer to the alloying zone of a wafer in the bore except by conduction through the wafer substantially in a plane parallel to its major surfaces.

More specifically, the fixture includes an open-ended hollow member adapted to be coaxially received within the bore. The internal cross-section of the hollow member is shaped and dimensioned to contain a body of alloying metal for alloying to the semiconductor wafer and to define the region to be alloyed. The axial dimension of the tubular member is such, in relation to the length of the bore, that when the member is positioned in the bore the member is laterally enveloped along its entire length by the sidewalls of the bore. Means of low thermal conductivity shield the member from heat transfer from the sidewalls and the open-end of the bore.

In accordance with another feature of the invention the fixture includes means for inducing conductive heat flow to the interior of the alloying boat.

In accordance with still another feature of the invention the fixture is provided with inlet and outlet passages to and from the region of the bore containing the semiconductor wafer and means for directing a stream of an inert gaseous medium through the passages so as to flush out any impurity vapors which might be present.

Further objects of the invention, its advantages, scope and the manner in which it may be practiced will be readily apparent to persons conversant with the art from the following description and subjoined claims taken in conjunction with the annexed drawings in which like reference characters denote like parts throughout the several views and in which, FIGURE 1 is a vertical sectional view illustrating a typical form of alloying fixture according to the prior art;

Figures 1, 2:
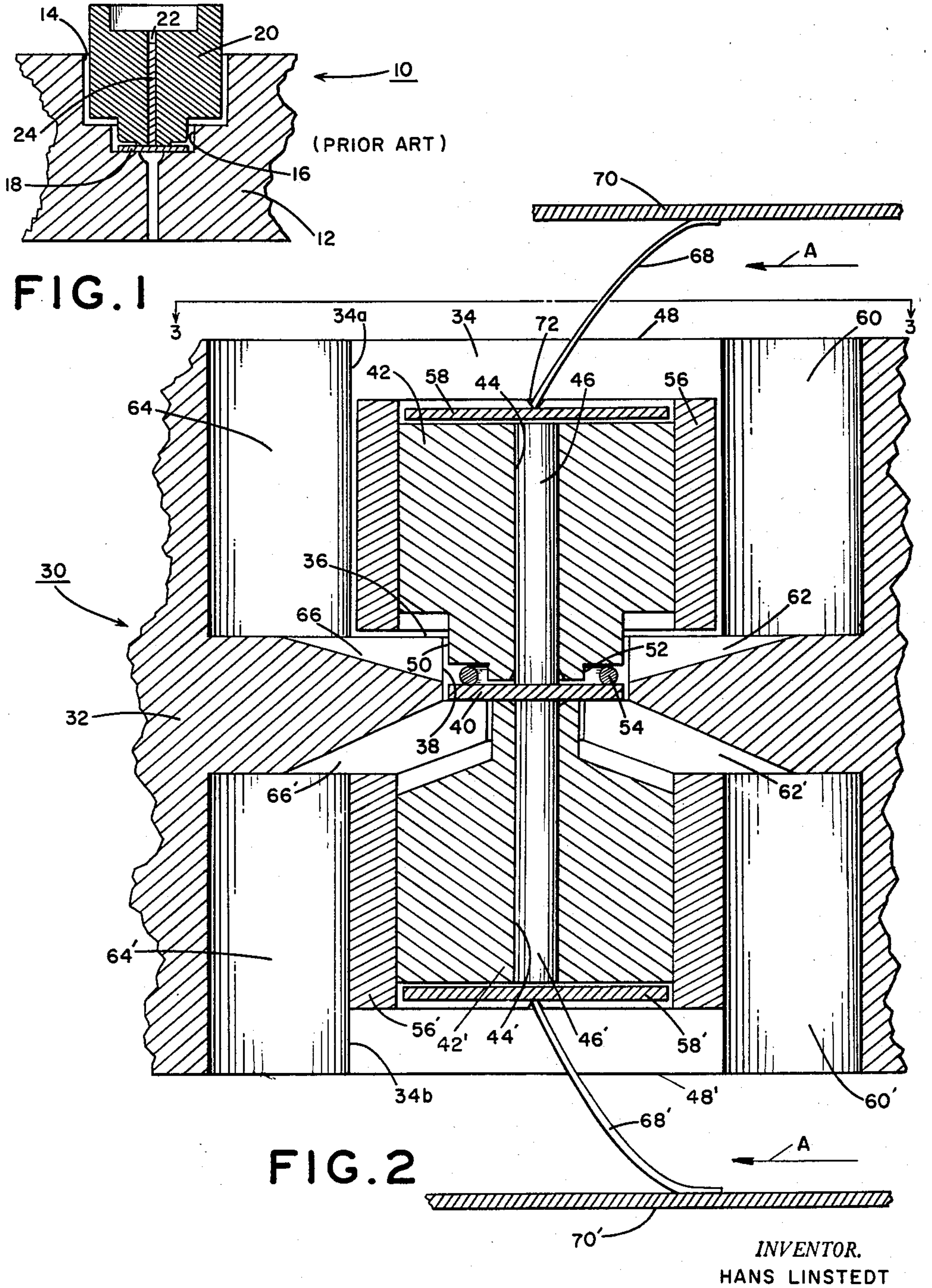
FIGURE 2 is a vertical sectional view, on an enlarged scale, illustrating an exemplary form of alloying fixtures in accordance with the present invention.

In FIGURE 1 there is illustrated an alloying fixture 10 which is more or less typical and representative of the prior art. The fixture comprises an alloying boat fragmentarily illustrated at 12. Boat 12 contains a bore or cavity 14 having a depression 16 in its bottom. The cross-sectional shape and dimension of depression 16 conform to those of and adapt it to receive a semiconductor wafer 18 to be alloyed.

The wafer 18 is maintained in position and weighted down by means of a tubular member 20 known as a "plug." Plug 20 is adapted to be slidably received within cavity 14. The interior of plug 20 conforms in shape, location and dimension to the PN junction to be formed on the upper surface of wafer 18. Therefore, when alloying material is placed within plug 20 it is automatically located and maintained in the correct position on the upper surface of wafer 18.

The alloying material may be in the form of a pellet of appropriate size which is dropped into the hollow interior of the plug and then weighted down by a member known as a "pin" (not shown) freely slidably disposed in the plug. The alloying material may also be in the form of a powder loaded into the plug and weighted down by a pin. In FIGURE 1 the alloying material is shown in the form of a rod or wire 24 which is a snug fit in plug 20 and has its lower end protruding by a predetermined amount beyond the bottom surface of the plug. In this way the protruding end of the alloy wire abuts the upper surface of the wafer to be alloyed and supports the plug member.

By reference to FIGURE 1 and a consideration of the physical dimensions and characteristics of the conventional alloying fixtures which the illustration represents, it will be appreciated that when the fixture is disclosed in the alloying furnace an axial temperature gradient is established between the exterior surfaces of boat 12 and plug member 20 which are exposed to the radiant heat, and the locus of wafer 18. Due to the mass of the alloying boat, its thermal inertia is greater than that of the plug with the result that primary heat transfer occurs from the exposed end of the plug to the wafer in a path parallel to the longitudinal axis of the plug. Moreover, this particular heat transfer pattern is even more prevalent when the alloying material is in the form of a wire because the wire extends along substantially the entire length of the plug and would almost certainly have a higher thermal conductivity than the plug and boat. Even where a pellet or powder formed of alloying material is used in conjunction with a pin, the pin conducts heat to the alloying region in the direction of the axis of the plug. In any case the result is that the alloying temperature is reached in the locus of contact between the alloying material and the wafer surfaces and before the remainder of the wafer is brought to temperature the semiconductor and alloying metal begin to fuse. Thus a temperature gradient, perpendicular to the plane of the wafer, is established in the melt.

Inasmuch as the alloying period must necessarily be kept short to prevent complete melting and formation of an eutectic alloy there is little or no opportunity for the melt to mix thoroughly or achieve a proper thermal or compositional equilibrium. Upon removal of the fixture from the alloying oven, the cooling of the outer surfaces of the boat and the protruding end of the tubular plug member once again favors heat transfer along the axis of the plug member establishing an axial temperature gradient in the system. Consequently, as the semiconductor material crystallizes out of the melt its concentration in the molten layer immediately contiguous to the (unfused) bulk of the wafer increases, with the result that there is created an increasing concentration gradient in a direction normal to the plane of the wafer, in accordance with the temperature gradient.

Inasmuch as the liquidus phase boundary curve increases with increasing semiconductor content in all of the compositional systems involved in the formation of PN junctions for semiconductor devices, the heat transfer conditions described result in a super-cooling of the alloy melt.

Referring this discussion to the specific case of a silicon wafer alloyed with aluminum, the temperature gradient and other heat transfer conditions existing in conventional alloy fixtures result in a more or less broad front of elevated temperature moving along the aluminum alloying material to the silicon. The maximum temperature reached in the aluminum is, of course, below its melting point, as experience shows that the aluminum does not melt as a complete entity in the process. Experiments have shown that, under these conditions, super-cooling can occur with the start of crystallization. This super-cooling may lead to the growth of fine columnar projections, of silicon richly doped with aluminum, on the liquid/solid boundary surface. Portions of the melt poor in silicon accumulate between the projections until the intervening material finally solidifies as the eutectic alloy. Consequently, the recrystallized region which results is dendritic in structure, made up of columns of material deficient in silicon interspersed with columns of silicon richly doped with aluminum. The resistance characteristics of the resulting junction are, therefore, poor, especially when the recrystallized silicon layer is relatively thin, in localized regions or over the entire melt. Furthermore, the silicon crystals which remain undissolved retain heat and, consequently, remain plastic, the longest with the result that the very basis of a silicon transistor may contain distortions. The more silicon dissolved, the wider the super-cooling field and the more deleterious is the effect described.

With alloying fixtures according to the present invention, exemplary embodiments of which will be described presently, preferred heat transfer paths are established through and in the plane of the semiconductor wafer rather than through the tubular plug member and/or the alloying body.

Reverting now to the drawings and first particularly to FIGURE 2, there is illustrated an alloying fixture 30 according to the present invention which fixture may be considered as a complete entity in itself or a unitary fragment of a fixture for simultaneously alloying a plurality of wafers. Fixture 30 comprises a boat 32, of suitable refractory material, provided with a cavity or bore 34 open at least one end and adapted to receive therein, in a plane substantially perpendicular to its longitudinal axis, a wafer of semiconductor material. In the illustrated embodiment, bore 34 extends entirely through the boat thereby adapting the fixture for simultaneous alloying of junctions on both surfaces of a semiconductor wafer as in the fabrication of transistors. It will be appreciated, however, that if desired for the production of diodes, or for alloying transistor junctions on one face of a wafer at a time, bore 34 can be closed at one end, i.e., provided with a bottom closure surface on which the wafer is supported during alloying.

Reverting to the particular structure illustrated in FIGURE 2, bore 34 is adapted to receive and support a semiconductor wafer by means of an annular shoulder 36 containing a relatively shallow concentric recess 38 the cross-sectional shape and dimensions of which conform to those of and are adapted to receive the semiconductor wafer to be alloyed. For the purposes of example, the alloying fixture being described is specifically adapted for the fabrication of a transistor comprising a circular wafer and, accordingly, bore 34 and recess 36 are of cylindrical configuration.

Shoulder 36 for supporting the semiconductor wafer effectively divides bore 34 into two sections which will be referred to as upper and lower bores 34*a* and 34*b*, respectively, for convenience.

A semiconductor wafer 40 disposed in upper bore 34*a* is maintained in position and weighted down upon the bottom of recess 38 by means of a tubular plug member 42 usually of the same material as the boat, e.g., graphite. Plug member 42 is adapted to be slidably coaxially received within upper bore 34*a*; its inner surface 44 conforms in shape, location and dimension to the junction to be formed on the upper surface of wafer 40. In the illustrated embodiment the interior of tubular plug member 42 contains a rod or wire 46 of suitable alloy material, which is a snug fit therein and projects from its lower end. The axial or longitudinal dimension of plug 42 is substantially less than that of upper bore 34*a* so that when the plug is disposed in operative position, as shown, the upper end of the plug does not protrude beyond the upper surface 48 of the boat and, preferably, is recessed well below this surface. In this manner the area of the plug which would be exposed to heat radiation is effectively minimized even without the further provisions for control of heat transfer which will be described presently.

The lower end of plug 42 is formed with a reduced diameter portion 50 which fits within recess 38; a further reduced diameter section 52 at the extreme lower end of plug 42 serves to limit the downward movement of the plug member after fusion of the projecting end of alloying wire 46. Reduced section 52 also serves to define an annular clearance for the reception of a base ring preform 54 for forming the base electrode.

Plug member 42 is of substantially smaller diameter than upper bore 34*a* thus providing an intervening annular clearance space a portion of which is occupied by a hollow cylindrical sleeve 56 of refractory material of low thermal conductivity closely fitted to and coaxially enveloping the plug member. The outer diameter of sleeve 56 is somewhat smaller than the diameter of upper bore 34*a* so that appreciable clearance remains therebetween so as to avoid direct heat conduction from boat 32 to the sleeve and to permit a degree of lateral adjustment of the positions of the plug 42 in the bore. A cap 58 of material similar to or the same as that of sleeve 56 is provided on top of plug 42 to further impede heat absorption.

Despite careful cleaning, the boat and plugs evolve vapors of absorbed impurities during heating with adverse effect on the alloy melt. With alloying fixtures according to the present invention such vapors can be flushed out of the alloying region by the inert gaseous medium customarily employed as a protective atmosphere. To this end adjacent one side of bore 34*a*, boat 32 is provided with a passage 60 for the entrance of a gaseous medium. In the illustrated embodiment inlet passage 60 takes the form of a cylindrical bore parallel to and intersecting the wall of bore 34*a*. A milled slot 62 in annular shoulder 36 extending from the bottom of inlet passage bore 60 to recess 38 forms a communicating channel between the inlet passage and the region of bore 34*a* in which semiconductor wafer 40 is supported.

On another side of bore 34*a*, preferably diametrically opposite inlet passage 60, is an additional bore 64 parallel to and intersecting the sidewall of bore 34*a* to form an outlet passage for the inert gaseous medium. A milled slot 66 in annular shoulder 36 extending from the bottom of outlet bore 64 to recess 38 forms a communicating channel for the egress of the gaseous medium.

Figure 3:
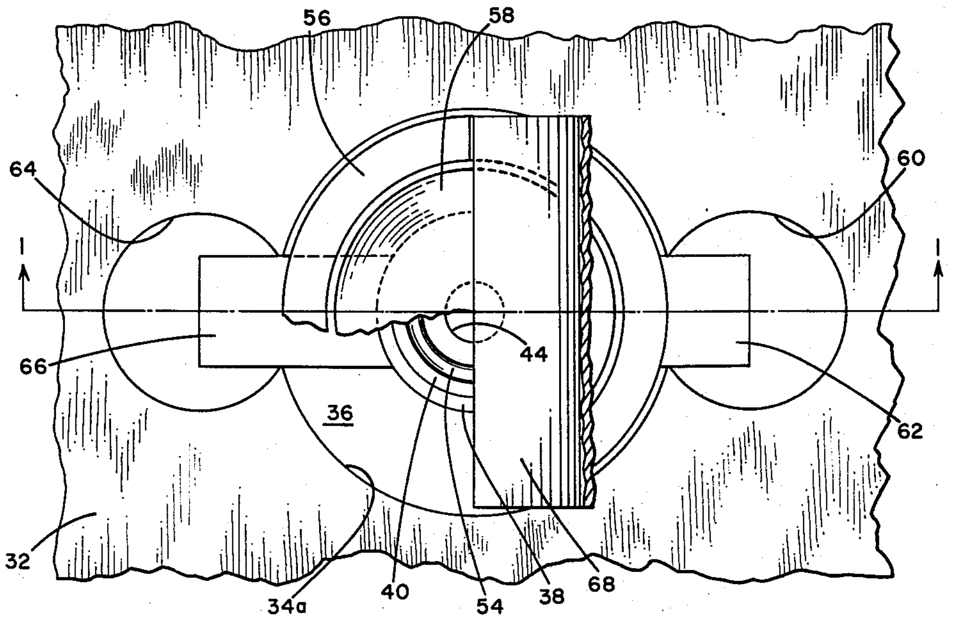
FIGURE 3 is a top plan view of the apparatus shown in FIGURE 2 partly in section and as viewed from line 3—3 of FIGURE 2 looking in the direction of the arrows.

A cantilever leaf-spring 68 is provided to retain cap 58, plug 42 and sleeve 56. One end of spring 68 is fixed to a surface 70 spaced above and extending generally parallel to upper surface 48 of the alloying boat. As best appears in FIGURE 3, the width of leaf-spring 68 is only slightly less than the diameter of upper bore 34*a* and approximates the outer diameter of insulating sleeve 56. The upper end surface of sleeve 56 is provided with suitable notches 72 at diametrically opposite points on its circumference for the reception of the free end of the leaf-spring 68. The length and curvature of leaf-spring 68 are such that the spring exerts a resilient force urging the plug 42 and sleeve 56 assembly axially into bore 34*a* and maintains cap 58 in position. In addition to this function, the leaf spring serves to deflect into inlet passage 60 an inert gaseous medium flowing parallel to upper surface 48 of the boat. Preferably leaf-spring 68 is left in an unpolished or rough state to avoid reflection of heat into bore 34*a* of the alloying boat.

The structure thus far described is substantially duplicated for lower bore 34*b* and is identified by corresponding, primed reference numerals. In lower bore 34*b*, however, the outer diameter of the heat insulating sleeve 56′ forms a close fit in the bore so that the alloying wire 46′ is automatically positioned in a predetermined location. This facilitates alignment of the junctions on the respective faces of the wafer. A similar arrangement may be provided for the upper plug and sleeve assembly also, or both upper and lower assemblies may be a loose fit.

The alloying fixture is utilized and operates in the following manner: the plug and sleeve members initially are removed from the respective sections of the bore 34 and semiconductor wafer 40 is disposed in recess 38. Base ring preform 54, the upper sleeve and plug assembly 42, 56, and cap 58 are replaced in the order named, alloying wire 46 having been loaded into the plug member previously.

If the alloying material being used is in the form of a pellet or powder the loading procedure may be varied by inserting the pellet or powder and a pin into the plug prior to the installation of cap 58. The lower half of the fixture is loaded in the same manner.

The structures 70, 70′ to which the cantilever leaf-springs 68, 68′ are fastened preferably are mechanically connected to the alloy boat but removable therefrom in a manner which will be described hereinbelow. In this way the springs may be brought into position after the upper side of the fixture is loaded so as to retain the elements while the fixture is inverted to load the other side.

It will be noted that the regions of intersection of the bores 34*a*, 34*b*, with the gas inlet and outlet bores 60, 60′ and 64, 64′, respectively, define slots in the sidewalls of the bores. These slots, together with the inlet and outlet bores, enable the insertion of forceps to facilitate loading and unloading the fixture.

The loaded fixture is inserted into a suitable alloying furnace and provisions made for causing an inert protective atmosphere to flow in a direction parallel to the upper and lower surfaces 48, 48′ of the boat as indicated by the arrows A.

From the structure described and a consideration of FIGURE 2, it will be appreciated that plugs 42, 42′ and alloying wires 46, 46′ are completely isolated from exposure to radiant heat or contact with any structure from which heat could be absorbed by conduction. Specifically, radiant heat from the furnace is blocked by the presence of the insulating caps 58, 58′ and by the fact that the respective ends of the plugs and alloying wires are recessed below the surfaces 48, 48′ of the alloying boat. Conduction of heat from the boat to plugs 42, 42′ is blocked by the heat insulating sleeves 56, 56′ and, in the case of the upper plug, additionally by the clearance space around sleeve 56.

The remaining surface areas of the plug members are relatively small as compared to the total area and are in proximity to surfaces of the alloying boat in the interior regions only which would be the last to heat; nevertheless these areas are separated by clearance spaces throughout to preclude heat transfer by conduction. Consequently, heat transferred to the alloying regions takes place primarily from the portions of boat 32 laterally surrounding wafer 40 and in a plane parallel to its major surfaces. The entire boat 32 heats up while plugs 42, 42′ effectively cool the alloying zone until heated by conduction from the boat through the wafer. Only then does alloying begin. On cooling, the entire boat cools first and the plug last by conduction through the wafer to the boat. Thus it will be appreciated that the temperature relations are exactly reversed: while during heating the wafer was hotter than the plugs, and the alloying wires, during cooling, the undissolved wafer is cooler. Consequently, no super-cooling of the melt occurs and orderly crystallization takes place.

The inert protective gas flowing parallel to the top and bottom surfaces 48, 48′ of the alloying boat is deflected by the cantilever leaf springs 68, 68′ into the inlet passages 60, 60′ and communicating channels 62, 62′ and flows through the region of bore 34 where the alloying occurs and where impurity vapors would be detrimental. Such vapors are carried off through the exit channels 66, 66′ and passages 64, 64′ into the main stream of the gas and out of the furnace.

Figure 4:
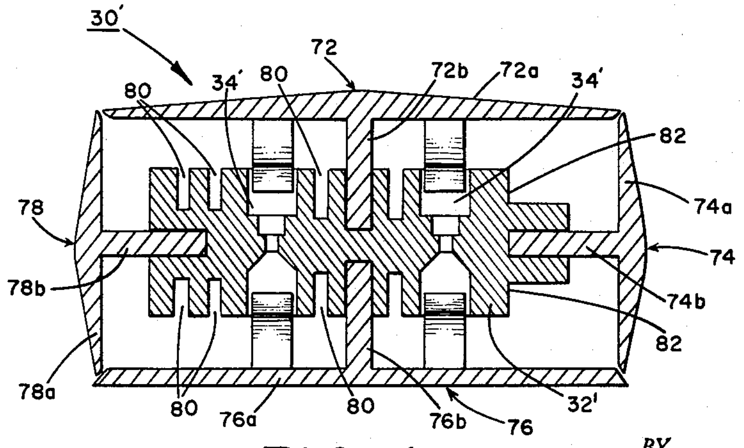
FIGURE 4 is a vertical sectional view, on a smaller scale than FIGURES 2 and 3, of a multiple unit alloying fixture according to the present invention.

In FIGURE 4 there is illustrated an alloying fixture assembly 30′ including units for simultaneously containing and alloying two semiconductor wafers (not shown) and additional provisions for controlling heat transfer, as will now be explained. The fixture consists of an alloying boat 32′ containing two bores 34′ comparable to bore 34 in the previously described embodiment. In the interests of simplicity and because of the reduced scale of this figure the removable elements of the fixture such as the plugs, sleeves, caps, etc. have been omitted. It will be understood, however, that such elements may be in all respects identical to those already described.

Alloying fixture 30′ is provided with a plurality of heat radiation receiver members 72, 74, 76, and 78. These radiation receiver members are of metals or alloys of higher heat conductivity than the material of which the alloying boat is formed, for example, copper, silver, aluminum and alloys thereof. In the event that it is not possible to use the preferred metals as, for example, where copper could not be tolerated because of contamination, or silver because of cost, or aluminum because of its low melting point, members 72, 74, 76, 78 may be made of steel.

Each of the heat radiation members takes the form of a substantially flat plate 72*a*, 74*a*, 76*a*, 78*a* conforming in shape to, but of somewhat larger dimensions than the particular side of the boat with which it is to be associated. Thus, for example, in the particular embodiment illustrated in FIGURE 4, 72*a* and 76*a* of the top and bottom radiation receivers are of the same general shape and plan view as the top and bottom surfaces 48, 48' of the alloying boat, respectively, but are of larger dimension so as to extend beyond the alloying boat in all directions. In like manner, plates 74*a* and 78*a* of the side radiation receivers 74, 78 correspond in shape to the sides of the alloying boat but are somewhat larger in each dimension.

Projecting from the inner surface each of the radiation receiver plates 72*a*–78*a* is a respective rib 72*b*, 74*b*, 76*b*, 78*b* each received in a complementary, suitably located slot in the alloying boat. The ribs (72*b*, 76*b*) of the top and bottom heat radiation receivers extend into the alloying boat in a common plane at a location symmetrically disposed with respect to the adjacent alloying bores. Ribs 72*b*, 76*b* terminate in the vicinity of a medial plane through the alloying boat and passing through the wafers being alloyed. The ribs (74*b*, 78*b*) from the side heat radiation receivers extend into the alloying boat substantially along said medial plane and terminate in the vicinity of the respective alloying bores. Inasmuch as the ribs serve as preferred heat conduction paths, it will be appreciated that they may be suitably designed with respect to length and location as to effect generally symmetrical heat transfer to the wafer being alloyed. If necessary or desirable, as may be the case where the radiation receivers are of steel rather than a metal of higher conductivity, heat conduction along undesired paths is minimized by the provision of suitably located slots 80 in the alloying boat interposed between the alloying bores and the source of heat sought to be blocked; alternatively, the corners of the boat can be cut away as at 82.

Preferably the ribs of the heat radiation receivers are removably received in their respective slots and, if necessary, the radiation receivers may be maintained in position after installation by any suitable means, not shown. Cantilever leaf-springs 68 and 68' heretofore described in conjunction with FIGURES 2 and 3 conveniently are secured to the inner surfaces of top and bottom heat radiation receivers 72 and 76, respectively. Side radiation receivers, of course, are provided on two sides only, the other two sides being left open to permit flow of the inert gas through the fixtures as heretofore described.

It will be appreciated that in many cases it may be possible suitably to regulate and obtain the desired heat transmission pattern without resort to all of the various structural measures herein described. Thus, for example, in any given fixture, it may be possible to eliminate the heat radiation receivers or some of them; alternatively, slots 80 and cut-outs 82 for blocking heat conduction may be omitted, particularly in cases where the heat radiation receivers are used and are constructed of metals of particularly high heat conductivity such as copper, aluminum, or silver.

It will also be appreciated that the particular construction may be varied to produce different heat flow and distribution in the upper and lower bores of the boat so that the conditions of alloying may be different for and adjusted to the particular requirements of an emitter junction on one surface and a collector junction on the other surface of the wafer.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed and desired to be secured by United States Letters Patent is:

1. A fixture for alloying rectifying junctions onto a semiconductor wafer, comprising: an alloying boat containing a bore of substantial length open at at least one end, said bore being adapted to receive therein, in a plane substantially perpendicular to its longitudinal axis, a semiconductor wafer for alloying; means for supporting such a wafer in said bore in such a plane; a tubular member adapted to be coaxially disposed within said bore, the interior of said tubular member being dimensioned and shaped to contain a body of alloy material in contact with a major surface of a semiconductor wafer supported in said bore, said tubular member being so dimensioned that, when disposed in the bore, the external surfaces thereof are spaced out of contact with said boat at all points and the outer end of said tubular member does not protrude from the bore; a sleeve of material of low thermal conductivity laterally enveloping said tubular member and shielding it from heat conduction to and from the sidewalls of the bore; a cap of material of low thermal conductivity disposed on and substantially covering the upper end of the tubular member and shielding said member from heat transmission to and from the ambient atmosphere; means defining a pair of flow passages in said boat adjacent said bore at spaced locations; means defining communicating channels connecting said respective flow passages with the interior of said bore in the vicinity of a semiconductor wafer disposed therein; cantilever leaf-spring means resiliently biasing said sleeve, cap and tubular member axially into said bore and adapted to deflect into one of said flow passages a gaseous cooling medium flowing in a direction generally perpendicular to the axis of said bore; and means imbedded in said boat and having a higher thermal conductivity than said boat for accelerating thermal conduction from the exterior of said boat to selected regions of the interior thereof proximate the location in said bore wherein a semiconductor wafer may be disposed and supported.

2. A fixture for alloying rectifying junctions onto a semiconductor wafer, comprising: an alloying boat containing a bore of substantial length open at at least one end, said bore being adapted to receive therein in a plane substantially perpendicular to its longitudinal axis a semiconductor wafer for alloying; means for supporting such a wafer in said bore in such a plane; a tubular member adapted to be coaxially disposed within said bore, the interior of said tubular member being dimensioned and shaped to contain a body of alloy material snugly fitted therein and projecting from the tubular member into contact with a major surface of a semiconductor wafer supported in said bore, said tubular member being so dimensioned that, when disposed in the bore, the external surfaces thereof are spaced out of contact with said boat at all points and the outer end of said tubular member does not protrude from the bore; a sleeve of material of low thermal conductivity laterally enveloping said tubular member and shielding it from heat conduction to and from the sidewalls of the bore, the outer surface of said sleeve being spaced from said sidewalls; a cap of material of low thermal conductivity disposed on and substantially covering the upper end of the tubular member and shielding said member from heat radiation from the ambient atmosphere; leaf-spring means spring biasing said sleeve, cap and tubular member axially into said bore; and heat receiver means of a material of higher thermal conductivity than said boat for accelerating thermal conduction between the exterior and selected regions of the interior of said boat.

3. A fixture for alloying rectifying junctions onto semiconductor wafers comprising: an alloying boat containing a bore of substantial length and open at at least one end; means for supporting a semiconductor wafer within said bore in a plane substantially perpendicular to the longitudinal axis of said bore; an open-ended hollow plug member adapted to be coaxially received within said bore and adapted to contain a body of alloying material and to define the region to be alloyed on the wafer, the axial dimension of said plug member being substantially less than that of said bore; a protrusion on said boat adjacent the wafer when supported in said bore and extending toward the extremity of said wafer defining a preferred heat conduction path from the extremity of said wafer to the outer portion of said boat; and thermal heat-shielding means within said bore enclosing at least partially the plug and bore to substantially deter heat conduction from the wafer along other paths.

4. An alloying fixture as claimed in claim 3 wherein said heat shielding means comprises a hollow cylindrical member positioned in said bore enclosing said plug member and formed from material having a low thermal conductivity relative to said boat.

5. An alloying fixture as claimed in claim 3 further including a radiation heat receiver means of a material of higher thermal conductivity than that of the alloying boat, said heat receiver means comprising surfaces of relatively large areas disposed about said alloying boat and having projections thereon extending into the interior of the alloying boat and terminating in the vicinity of the region of said bore wherein a semiconductor wafer is supported.

6. An alloying fixture as claimed in claim 3 including passage defining means for cooling fluid in said boat adjacent one side of the bore and in flow communication therewith; second passage defining means for cooling fluid in said boat adjacent another side of said bore and in flow communication therewith; and means defining communicating channels connecting said respective flow passages with the interior of said bore in the vicinity of the region wherein the semiconductor wafer is supported.

7. An alloying fixture as claimed in claim 6 further including baffle means adjacent the open end of said bore adapted to deflect into one of said flow passages a gaseous medium flowing in a direction perpendicular to the axis of said bore.

References Cited in the file of this patent

UNITED STATES PATENTS

| | | |
|---|---|---|
| 2,942,568 | Hamilton | June 28, 1960 |
| 2,943,005 | Rose | June 28, 1960 |

FOREIGN PATENTS

| | | |
|---|---|---|
| 1,067,935 | Germany | Oct. 29, 1959 |

OTHER REFERENCES

IBM Technical Disclosure Bulletin, vol. 2, No. 4, pages 79 and 80, December 1959. (Copy in 148/1.5.)